(12) United States Patent
Dhas et al.

(10) Patent No.: US 9,617,637 B2
(45) Date of Patent: Apr. 11, 2017

(54) SYSTEMS AND METHODS FOR IMPROVING DEPOSITION RATE UNIFORMITY AND REDUCING DEFECTS IN SUBSTRATE PROCESSING SYSTEMS

(71) Applicant: Lam Research Corporation, Fremont, CA (US)

(72) Inventors: Arul Dhas, Sherwood, OR (US); Brannon Kelley, Sherwood, OR (US); Jaswinder Guiliani, Beaverton, OR (US); Akhil Singhal, Beaverton, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 163 days.

(21) Appl. No.: 14/331,704

(22) Filed: Jul. 15, 2014

(65) Prior Publication Data

US 2016/0017493 A1  Jan. 21, 2016

(51) Int. Cl.
*C23C 16/50* (2006.01)
*H01J 37/00* (2006.01)
*H01L 21/00* (2006.01)
*C23C 16/455* (2006.01)
*C23C 16/52* (2006.01)

(52) U.S. Cl.
CPC ........ *C23C 16/50* (2013.01); *C23C 16/45561* (2013.01); *C23C 16/52* (2013.01); *H01J 37/00* (2013.01); *H01L 21/00* (2013.01)

(58) Field of Classification Search
CPC ......... H01J 37/00; H01J 37/32; H01J 37/3244
USPC ....... 427/533, 534, 535, 537, 539, 569, 570, 427/573, 574, 576, 768; 118/720, 723 R, 118/723 MW, 723 ME, 723 MR, 118/723 MA, 723 AN, 723 E, 723 ER, 118/723 I, 723 IR
See application file for complete search history.

(56) References Cited

U.S. PATENT DOCUMENTS

| | | | | |
|---|---|---|---|---|
| 6,663,716 B2 | 12/2003 | Loan et al. | | |
| 6,820,570 B2* | 11/2004 | Kilpela | ............... | C23C 16/4412 118/723 E |
| 7,704,894 B1* | 4/2010 | Henri | ................... | C23C 16/402 438/296 |
| 8,017,527 B1* | 9/2011 | Dhas | ................... | C23C 16/4401 118/29 |
| 2004/0118342 A1* | 6/2004 | Cheng | ................ | C23C 16/4412 118/715 |

(Continued)

FOREIGN PATENT DOCUMENTS

FI  WO 2012136876 A1 * 10/2012 ........... C23C 16/403

*Primary Examiner* — David Turocy
*Assistant Examiner* — Mohammad Mayy

(57) ABSTRACT

Systems and methods for delivering liquid precursor in a substrate processing system include supplying liquid precursor using a first valve in fluid communication with a liquid precursor source; supplying purge gas using a second valve in fluid communication with a purge gas source; arranging a third valve having a first input port in fluid communication with an output port of the first valve and a second input port in fluid communication with an output port of the second valve; arranging an input port of a first divert injector valve in fluid communication with an output port of the third valve; and operating the first valve, the second valve, the third valve and the first divert injector valve in first, second, third and fourth modes.

10 Claims, 6 Drawing Sheets

(56) References Cited

U.S. PATENT DOCUMENTS

2008/0241381 A1* 10/2008 Suzuki ................ C23C 16/0209
427/255.28
2011/0111136 A1* 5/2011 Slevin ................. C23C 16/4402
427/569

* cited by examiner

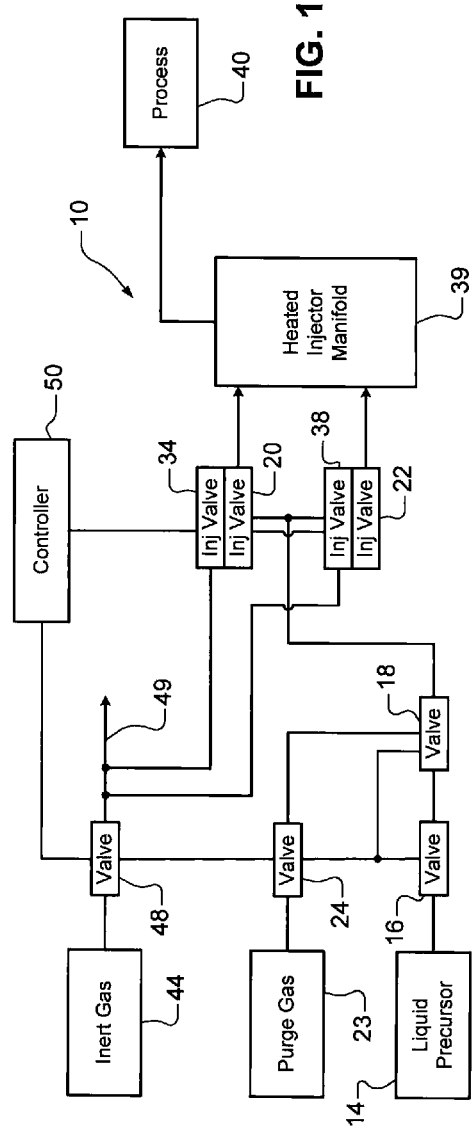
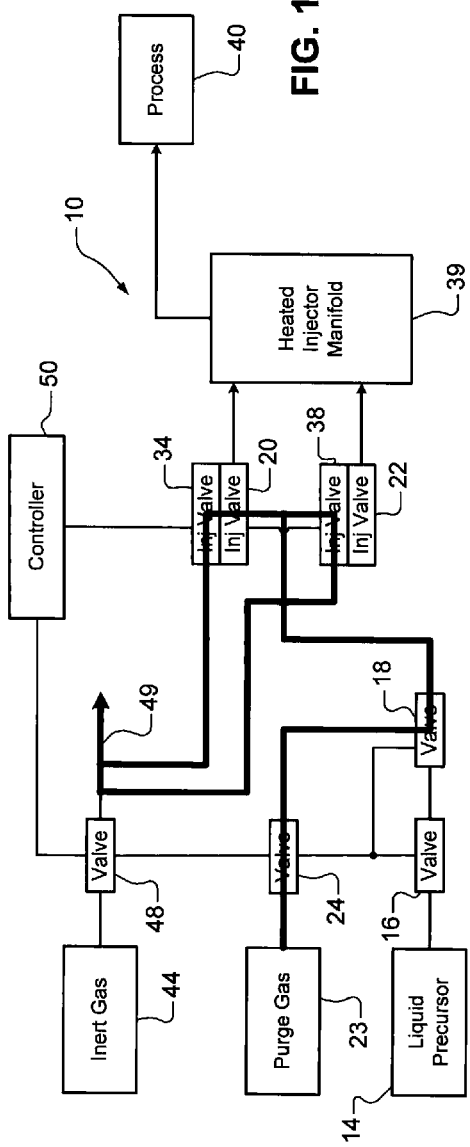
FIG. 1A
FIG. 1B

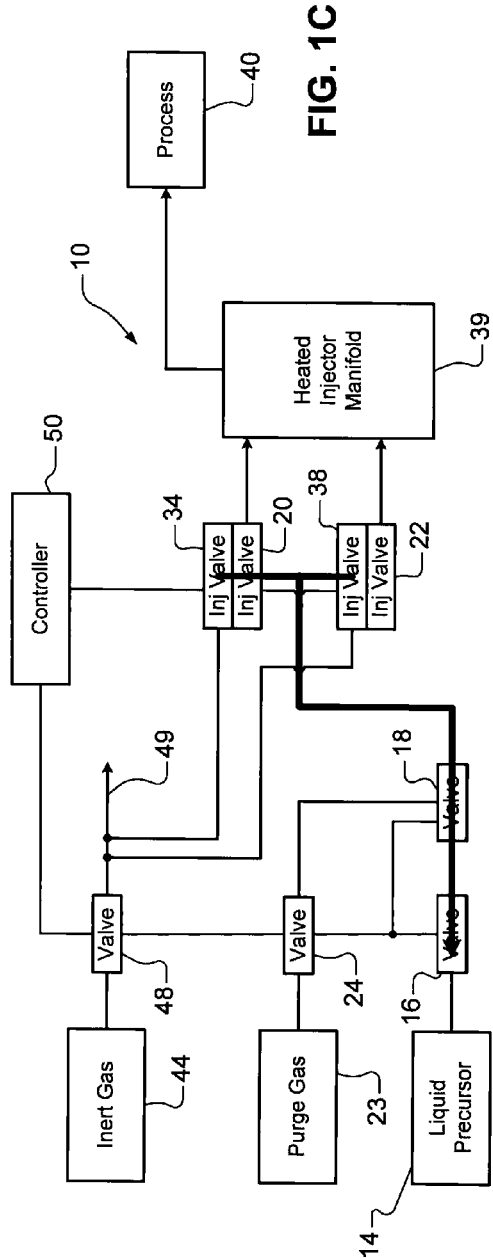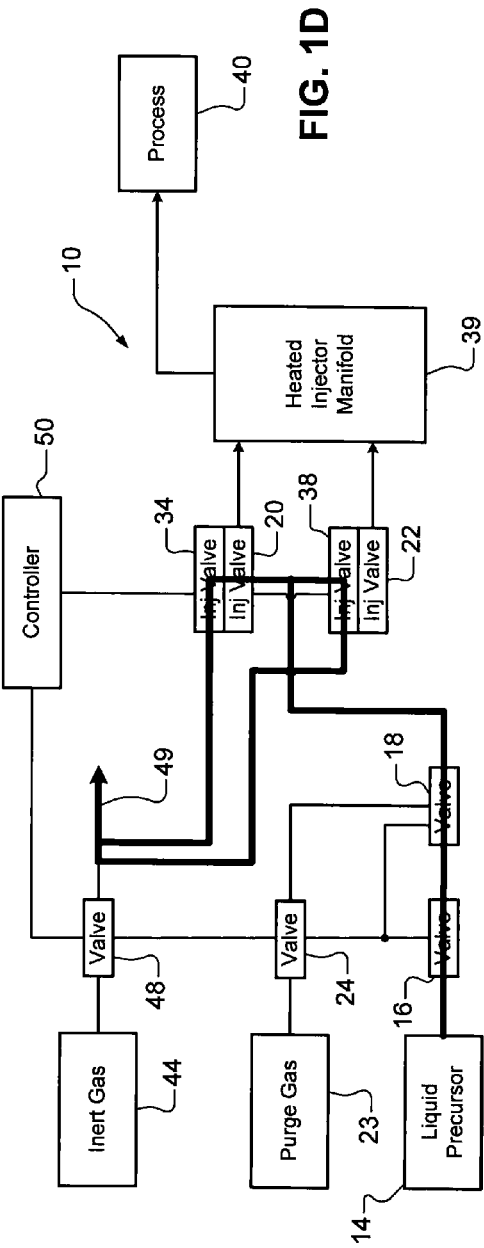

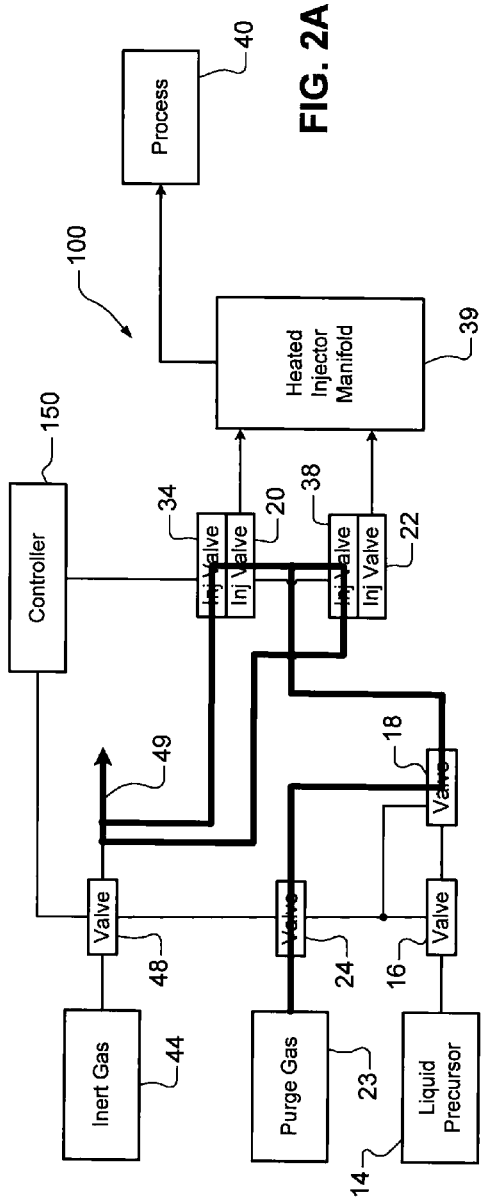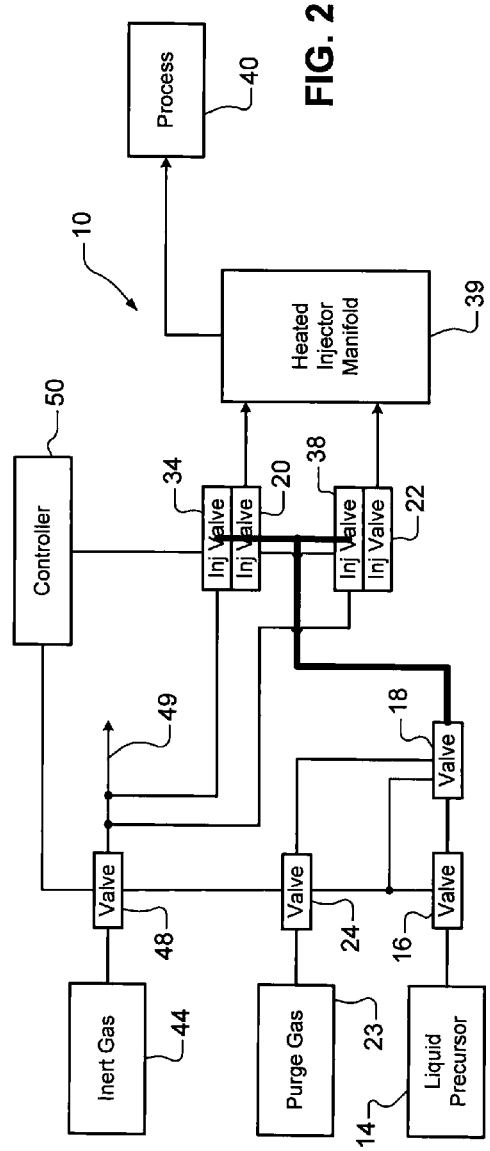

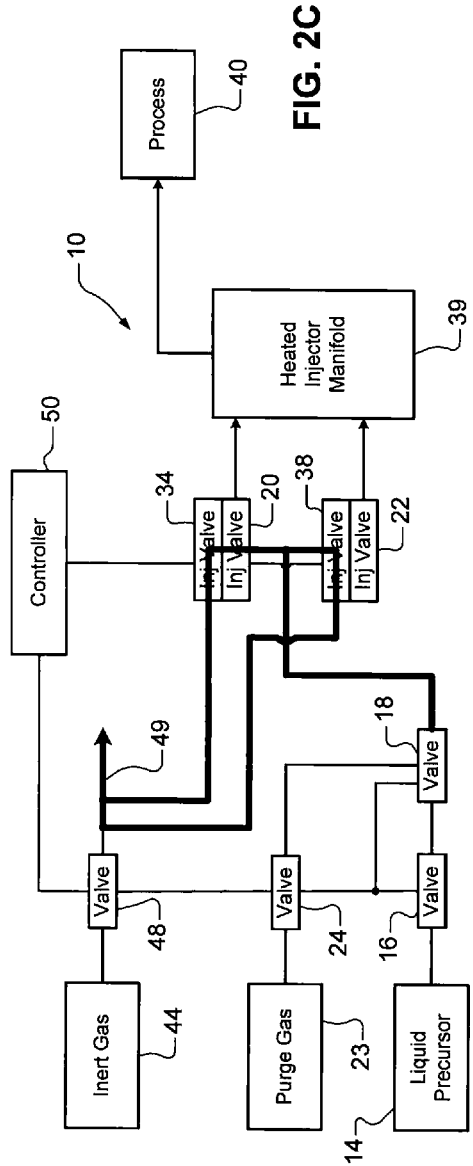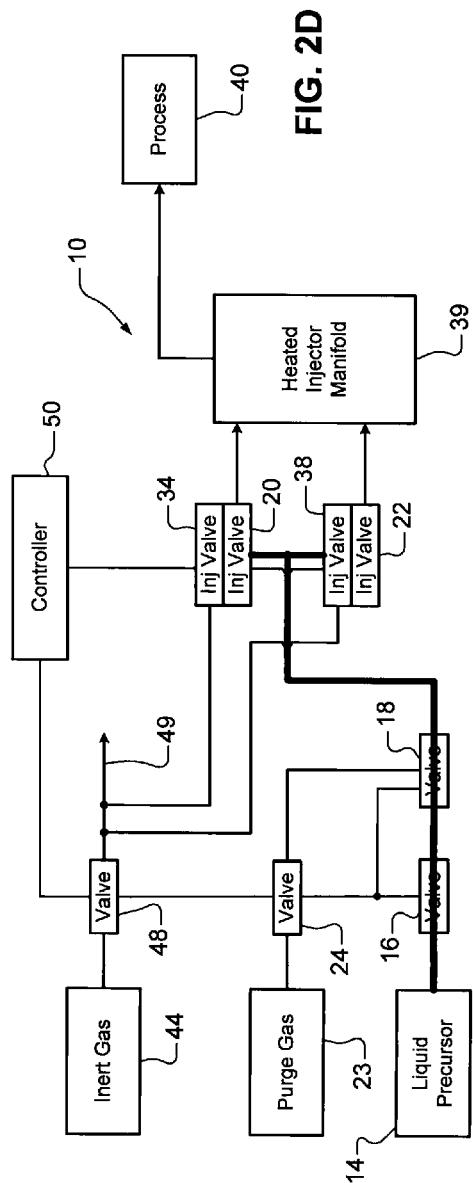

SYSTEMS AND METHODS FOR IMPROVING DEPOSITION RATE UNIFORMITY AND REDUCING DEFECTS IN SUBSTRATE PROCESSING SYSTEMS

FIELD

The present disclosure relates to substrate processing systems, and more particularly to systems and methods for reducing defects and improving deposition rate uniformity of interlayer dielectrics.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems are used to deposit film on a substrate. For example, the substrate processing system may perform chemical vapor deposition (CVD), plasma-enhanced (PE) CVD, atomic layer deposition (ALD), PEALD, etc. Deposition may be performed by supplying a gas mixture to a processing chamber. The gas mixture may include one or more gases that are mixed together.

In some situations, a liquid precursor may be vaporized into a carrier gas. Precise metering of the liquid precursor is performed to ensure that the correct gas mixture is formed in the processing chamber. As device size continues to shrink, it is becoming more important for substrate processing systems to improve deposition rate uniformity and to decrease defects.

SUMMARY

A method for delivering liquid precursor in a substrate processing system includes supplying liquid precursor using a first valve in fluid communication with a liquid precursor source; supplying purge gas using a second valve in fluid communication with a purge gas source; arranging a third valve having a first input port in fluid communication with an output port of the first valve and a second input port in fluid communication with an output port of the second valve; arranging an input port of a first divert injector valve in fluid communication with an output port of the third valve; and operating the first valve, the second valve, the third valve and the first divert injector valve in first, second, third and fourth modes. When there is no request for liquid precursor, the method includes configuring in the first mode and closing the first valve, opening the second valve, supplying the purge gas with the third valve and opening the first divert injector valve. When there is a request for liquid precursor, the method includes configuring sequentially in the second mode, the third mode and the fourth mode. Configuring in the second mode includes closing the first valve, the second valve, the third valve and the first divert injector valve. Configuring in the third mode includes closing the first valve, the second valve, and the third valve and opening the first divert injector valve. Configuring in the fourth mode includes opening the first valve, closing the second valve, supplying the liquid precursor using the third valve and closing the first divert injector valve.

In other features, the method includes arranging an input port of a first injector valve in fluid communication with the output port of the third valve and an output port of the first injector valve in fluid communication with a heated injector manifold.

In other features, a second divert injector valve has an input port in fluid communication with the output port of the third valve. A second injector valve has an input port in fluid communication with the output port of the third valve and an output port in fluid communication with the heated injector manifold.

In other features, the method includes closing the first injector valve during the first mode, the second mode, the third mode and the fourth mode. The method includes selectively opening the first injector valve during a fifth mode, after the fourth mode, to selectively supply the liquid precursor to the heated injector manifold. The method includes selectively returning to the first mode when delivery of the liquid precursor is not needed.

In other features, the liquid precursor comprises tetraethyl orthosilicate (TEOS). The purge gas comprises helium. The method includes performing plasma-enhanced chemical vapor deposition (PECVD) using the substrate processing system. The liquid precursor comprises tetraethyl orthosilicate (TEOS) and the purge gas comprises helium.

In other features, the method includes depositing an interlayer dielectric (ILD) on the substrate.

A liquid precursor delivery system for a substrate processing system includes a first valve in fluid communication with a liquid precursor source. A second valve is in fluid communication with a purge gas source. A third valve has a first input port in fluid communication with an output port of the first valve and a second input port in fluid communication with an output port of the second valve. A first divert injector valve has an input port in fluid communication with an output port of the second valve. A controller is configured to operate the first valve, the second valve, the third valve and the first divert injector valve in first, second, third and fourth modes. When there is no request for liquid precursor, the controller configures in the first mode and closes the first valve, opens the second valve, supplies the purge gas using the third valve and opens the first divert injector valve. When there is a request for liquid precursor, the controller sequentially configures in the second mode, the third mode and the fourth mode. The controller configures in the second mode by closing the first valve, the second valve, the third valve and the first divert injector valve. The controller configures in the third mode by closing the first valve, the second valve, and the third valve and opening the first divert injector valve. The controller configures in the fourth mode by opening the first valve, closing the second valve, supplying the liquid precursor with the third valve and closing the first divert injector valve.

In other features, a first injector valve has an input port in fluid communication with the output port of the third valve and an output port in fluid communication with a heated injector manifold.

In other features, a second divert injector valve has an input port in fluid communication with the output port of the third valve. A second injector valve has an input port in fluid communication with the output port of the third valve and an output port in fluid communication with the heated injector manifold.

In other features, the controller is configured to close the first injector valve during the first mode, the second mode, the third mode and the fourth mode.

In other features, the controller is configured to selectively open the first injector valve during a fifth mode, after the fourth mode, to selectively supply the liquid precursor to the heated injector manifold. The controller is configured to selectively return to the first mode when delivery of the liquid precursor is not needed.

In other features, the liquid precursor comprises tetraethyl orthosilicate (TEOS). The purge gas comprises helium.

A substrate processing system includes the liquid precursor delivery system. A processing chamber includes a pedestal to support a substrate. A plasma generator selectively generates plasma in the processing chamber.

In other features, the substrate processing system performs plasma-enhanced chemical vapor deposition (PECVD). The liquid precursor comprises tetraethyl orthosilicate (TEOS) and the purge gas comprises helium. The substrate processing system is used to deposit an interlayer dielectric (ILD) on the substrate.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1A is a functional block diagram of an example liquid precursor delivery system for a substrate processing system;

FIG. 1B is a functional block diagram of the liquid precursor delivery system of FIG. 1A with the valves arranged in a first mode;

FIG. 1C is a functional block diagram of the liquid precursor delivery system of FIG. 1A with the valves arranged in a second mode;

FIG. 1D is a functional block diagram of the liquid precursor delivery system of FIG. 1A with the valves arranged in a third mode;

FIG. 2A is a functional block diagram of an example liquid precursor delivery system for a substrate processing system with the valves arranged in a first mode according to the present disclosure;

FIG. 2B is a functional block diagram of the example liquid precursor delivery system with the valves arranged in a second mode according to the present disclosure;

FIG. 2C is a functional block diagram of the example liquid precursor delivery system with the valves arranged in a third mode according to the present disclosure;

FIG. 2D is a functional block diagram of the example liquid precursor delivery system with the valves arranged in a fourth mode according to the present disclosure;

In the drawings, reference numbers may be reused to identify similar and/or identical elements.

DETAILED DESCRIPTION

Figure 3:
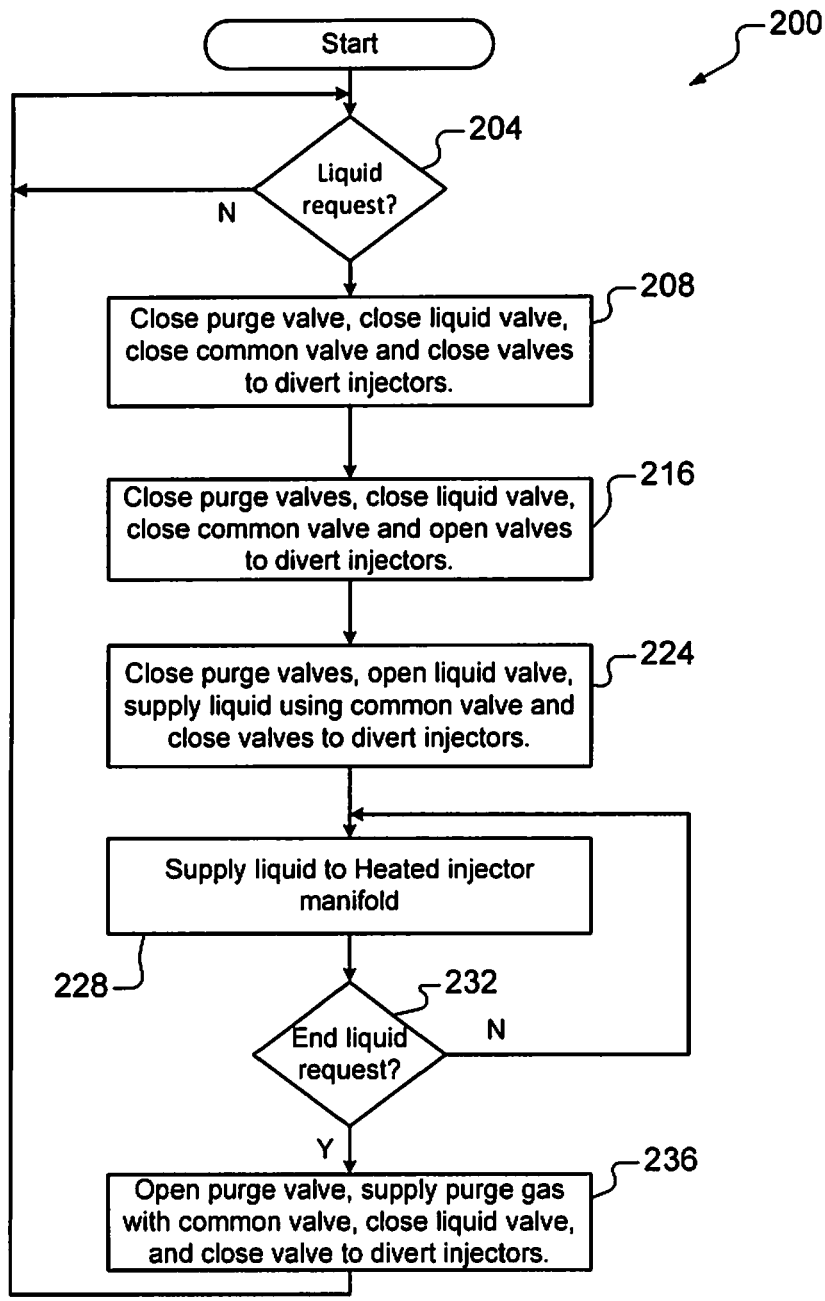
FIG. 3 illustrates an example method for controlling the liquid precursor delivery system according to the present disclosure.

Conventional substrate processing systems that handle interlayer dielectrics (ILDs) typically mix helium and tetraethyl orthosilicate (TEOS) liquid in delivery lines. The helium and TEOS mixture in the lines creates micro-bubbles during post clean, full-flush routines. Thin film deposition rates are very sensitive to the amount of helium in TEOS. In order to remove the TEOS and helium mixture (with microbubbles) in the TEOS supply conduit, priming may be performed. Priming involves using fresh TEOS liquid to push out the TEOS and helium mixture in the conduit before starting deposition. Extensive TEOS priming leads to elevated defects. The presence of residual helium microbubbles in the conduit leads to unstable film deposition rates.

Systems and methods according to the present disclosure substantially eliminate the mixing of TEOS and helium in supply conduits. As a result, the requirement for liquid TEOS priming is minimized. The systems and methods according to the present disclosure reduce defects and improve deposition rate uniformity.

Referring now to FIG. 1A, an example of liquid precursor delivery system 10 is shown. The liquid precursor delivery system 10 includes a liquid precursor source 14 that is in fluid communication with valves 16 and 18. The valve 18 may have two input ports and one output port. The valve 18 may have a closed position, a liquid precursor supply position and a purge gas supply position. The output port of the valve 18 is in fluid communication with injector valves 20 and 22 and divert injector valves 34 and 38.

Outputs of the injector valves 20 and 22 are in fluid communication with the heated injector manifold 39. An output of the heated injector manifold 39 is input to a process 40 such as a substrate processing system. An inert gas supply 44 supplies inert gas using a valve 48 to a conduit 49, which may be in fluid communication with a scrubbed exhaust system. Output ports of the divert injector valves 34 and 38 are connected to the conduit 49.

Referring now to FIG. 1B, the liquid precursor delivery system of FIG. 1A is shown with the valves arranged in a first mode when supply of liquid precursor is not needed. In the first mode, the valve 16 is closed, the valve 18 allows purge gas flow, the valve 24 is opened and the divert injector valves 34 and 38 are open. When liquid precursor is not being supplied, the purge gas flows through the valves 24 and 18 and is diverted by the divert injector valves 34 and 38 to the conduit 49.

Referring now to FIGS. 1C and 1D, the liquid precursor delivery system of FIG. 1A is shown with the valves arranged sequentially in a second mode (FIG. 1C) and in a third mode (FIG. 1D) when a request for liquid precursor is received by the controller 50. In FIG. 1C, the valve 24 is closed, the valve 18 is positioned to supply liquid precursor, the valve 16 is open and the divert injector valves 34 and 38 are closed.

In some examples, the pressure of the purge gas supply is higher than the pressure of the liquid precursor supply. For example only, the pressure of the purge gas supply may be about 55 psi and the pressure of the liquid precursor supply is lower than the pressure of the purge gas supply. When the valves are configured in the second mode, the purge gas tends to backflow into the liquid precursor due to the higher pressure of the purge gas. As a result, microbubbles may be created in the liquid precursor.

In FIG. 1D, the liquid precursor delivery system of FIG. 1A is shown with the valves arranged in the third mode. The valve 24 is closed, the valve 18 is positioned to supply liquid precursor, the valve 16 is open and the divert injector valves 34 and 38 are open. A predetermined amount of the liquid precursor flows through the divert injector valves 34 and 38 to prime the lines. For example only, approximately 15 ml of liquid precursor such as TEOS may be used to prime the lines. Thereafter, the divert injector valves 34 and 38 are closed.

During the first, second and third modes, the injector valves 20 and 22 are closed. After the third mode, the liquid precursor is ready to be supplied to the heated injector manifold 39. For example, the injector valves 20 and 22 may be selectively operated as needed to inject the liquid precursor into the heated injector manifold 39.

As can be appreciated, a controller 50 may be used to control operation of the valves 16, 18, 20, 22, 24, 34, 38 and 48 as described above.

Referring now to FIG. 2A, a liquid precursor delivery system 100 is shown. The liquid precursor delivery system 100 is similar to the system shown in FIGS. 1A-1D. However, a controller 150 operates the valves differently. The valves shown in FIG. 2A are arranged when liquid precursor is not being delivered. Purge gas is supplied by the purge gas supply 23 through the valve 24, the valve 18, and the divert injector valves 34 and 38 to the conduit 49.

Referring now to FIG. 2B-2D, the liquid precursor delivery system 100 is shown with the valves arranged in a second, third and fourth modes that occur sequentially in response to a request for liquid precursor. In FIG. 2B, the liquid precursor delivery system 100 is shown with the valves arranged in the second mode. In the second mode, the valves 16, 18 and 24 are closed. The purge gas is trapped between the divert injector valves 34 and 38 and the output port of the valve 18. There is no liquid precursor in these portions of the conduit, therefore microbubbles are not created.

In FIG. 2C, the liquid precursor delivery system 100 is shown with the valves arranged in the third mode. The valves 16, 18, 24 are closed and the divert injector valves 34 and 38 are open. The purge gas that was trapped during the second mode flows into the conduit 49 in the third mode.

In FIG. 2D, the liquid precursor delivery system 100 is shown with the valves arranged in the fourth mode. The valve 16 is opened, the valve 18 supplies liquid precursor, the valve 24 is closed and the divert injector valves 34 and 38 are closed. Liquid precursor flows into the conduit between the liquid precursor supply 14 and inlets input ports of the injector valves 20, 22, 34, and 38. The liquid precursor delivery system 100 is ready to supply liquid precursor using the injector valves 20 and 22.

Referring now to FIG. 3, an example method 200 for controlling the liquid precursor delivery system is shown. The method is shown at a starting point with the valves already arranged in the first mode. At 204, control determines whether there is a request for liquid precursor. If 204 is true, control proceeds with 208 and closes the valve 24 associated with the purge gas, closes the valve 16, closes the common valve 18 to supply neither purge gas nor liquid precursor, and closes the divert injector valves 34 and 38 (e.g. the second mode). At 216, control closes the valve 24 associated with the purge gas, closes the valve 16 associated with the liquid precursor, positions the common valve 18 to supply neither purge gas nor liquid precursor, and opens the divert injector valves 34 and 38 (e.g. the third mode).

At 224, control opens the valve 16 associated with the liquid precursor, positions the common valve 18 to supply liquid precursor, and closes the divert injector valves 34 and 38 (e.g. the fourth mode). At 228, control selectively supplies liquid precursor to the heated injector manifold 39 as needed using the injector valves 20 and 22. At 232, control determines whether the request for liquid precursor has ended. If 232 is true, control opens the valve 24, positions the valve 18 to flow purge gas, opens the valve 16 and closes the divert injector valves 34 and 38. As can be appreciated, control may wait one or more predetermined periods between one or more of the steps 208, 216 and/or 224 as needed to allow settling.

Figure 4:
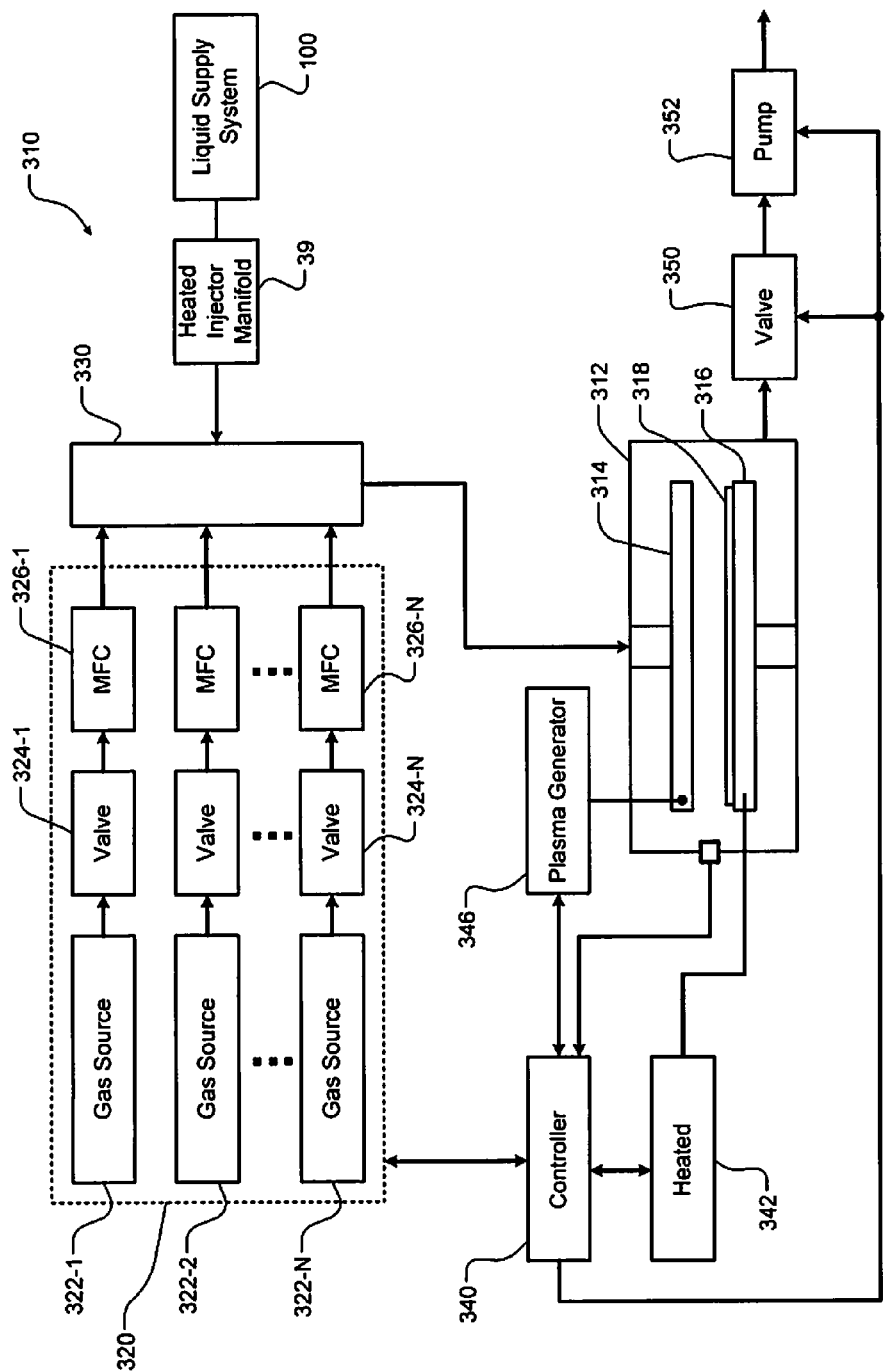
FIG. 4 illustrates an example of a substrate processing system incorporating the liquid precursor delivery system according to the present disclosure.

Referring now to FIG. 4, an example of a substrate processing system 310 used in conjunction with the pressure-based liquid flow control system is shown. In some examples, the substrate processing system is used to perform atomic layer deposition (ALD), plasma-enhanced (PE) ALD, chemical vapor deposition (CVD), or PECVD.

The substrate processing system 310 is shown to include a processing chamber 312. Gas may be supplied to the processing chamber using a gas distribution device 314 such as showerhead or other device. A substrate 318 such as a semiconductor wafer may be arranged on a pedestal 316 during processing. The pedestal 316 may be an electrostatic chuck, a mechanical chuck or other type of chuck.

A gas delivery system 320 may include one or more gas sources 322-2, 322-2, . . . , and 322-N (collectively gas sources 322), where N is an integer greater than one. Valves 324-1, 324-2, . . . , and 324-N, mass flow controllers 326-1, 326-2, . . . , and 326-N, or other flow control devices may be used to controllably supply a selected gas mixture to a manifold 330, which supplies the gas mixture to the processing chamber 312. The manifold 330 also receives an output of the heated injector manifold 39.

A controller 340 may be used to monitor process parameters such as temperature, pressure and process timing. The controller 340 may be implemented by the controller 50 or as a separate controller. The controller 340 may also be used to control process devices such as the gas delivery system 320, a pedestal heater 342, a plasma generator 346, and/or removal of reactants from the processing chamber 312. In some examples, a valve 350 and pump 352 may be used to remove reactants from the processing chamber 312. The RF plasma generator 346 may generate the RF plasma in the processing chamber. The RF plasma generator 346 may be an inductive or capacitive-type RF plasma generator. The RF plasma generator 346 may include a high frequency RF generator, a low frequency RF generator and a matching network (not shown).

First and second processes were run using the systems and methods described above in FIGS. 1A-1D and using TEOS as the liquid precursor, helium as the purge gas, and molecular nitrogen as the inert gas. The first and second processes had a target thickness of 150 Angstrom (Å). The first and second processes had a 16-20 A thickness range over the group of substrates that were run. A third process had a target range of 100 A and had a thickness range of ~12 A.

First and second processes were run using the systems and methods described above in FIGS. 2A-2D and using TEOS as the liquid precursor, helium as the purge gas, and molecular nitrogen as the inert gas. The first and second processes had a target thickness of 150 Angstrom (Å). The first and second processes had approximately 50% or more reduction in thickness range over the group of substrates that were run (less than 8 A). A third process had a target range of 100 A and had a thickness range of ~5 A. Likewise, a significant improvement in defect performance (on the order of 5 to 10 times) was achieved by the systems and methods described in FIGS. 2A-2D. Without being limited to any theory, the particle performance improvement may be mainly due to the elimination of a large amount of TEOS priming and chamber precoats that leaves residuals in the liquid precursor delivery system for ILDs. In some examples, priming is reduced by a factor of about 10.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A or B or C), using a non-exclusive logical OR. It should be understood that one or more steps within a method may be executed in different order (or concurrently) without altering the principles of the present disclosure.

In this application, including the definitions below, the term controller may be replaced with the term circuit. The term controller may refer to, be part of, or include an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple controllers. The term group processor encompasses a processor that, in combination with additional processors, executes some or all code from one or more controllers. The term shared memory encompasses a single memory that stores some or all code from multiple controllers. The term group memory encompasses a memory that, in combination with additional memories, stores some or all code from one or more controllers. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

The apparatuses and methods described in this application may be partially or fully implemented by one or more computer programs executed by one or more processors. The computer programs include processor-executable instructions that are stored on at least one non-transitory tangible computer readable medium. The computer programs may also include and/or rely on stored data.

What is claimed is:

1. A method for delivering liquid precursor in a substrate processing system, comprising:
   supplying liquid precursor using a first valve in fluid communication with a liquid precursor source;
   supplying purge gas using a second valve in fluid communication with a purge gas source;
   arranging a third valve having a first input port and a second input port independent of the first input port, wherein the first input port is in fluid communication with an output port of the first valve and the second input port is in fluid communication with an output port of the second valve, and wherein the third valve is arranged to selectively supply either one of (i) liquid precursor received via the first valve through the first input port or (ii) purge gas received via the second valve through the second input port;
   arranging an input port of a first divert injector valve in fluid communication with an output port of the third valve; and
   operating the first valve, the second valve, the third valve and the first divert injector valve in first, second, third and fourth modes,
   when there is no request for liquid precursor, configuring in the first mode and closing the first valve, opening the second valve to supply the purge gas to the second input port of the third valve, supplying the purge gas with the third valve and opening the first divert injector valve,
   in response to a request for liquid precursor, configuring sequentially in the second mode, the third mode and the fourth mode,
      wherein configuring in the second mode includes keeping the first valve closed, closing the second valve to stop the supply of purge gas to the third valve, and closing the third valve and the first divert injector valve to trap the purge gas in a conduit between the third valve and the first divert injector valve,
      wherein configuring in the third mode includes, immediately subsequent to the second mode, keeping the first valve, the second valve, and the third valve closed and opening the first divert injector valve to allow the purge gas trapped in the second mode to flow out of the conduit, and
      wherein configuring in the fourth mode includes opening the first valve to supply the liquid precursor to the first input port of the third valve, keeping the second valve closed, opening the third valve to supply the liquid precursor using the third valve and closing the first divert injector valve.

2. The method of claim 1, further comprising arranging an input port of a first injector valve in fluid communication with the output port of the third valve and an output port of the first injector valve in fluid communication with a heated injector manifold.

3. The method of claim 2, further comprising:
   a second divert injector valve having an input port in fluid communication with the output port of the third valve; and
   a second injector valve having an input port in fluid communication with the output port of the third valve and an output port in fluid communication with the heated injector manifold.

4. The method of claim 2, further comprising closing the first injector valve during the first mode, the second mode, the third mode and the fourth mode.

5. The method of claim 4, further comprising:
   selectively opening the first injector valve during a fifth mode, after the fourth mode, to selectively supply the liquid precursor to the heated injector manifold; and
   selectively returning to the first mode when delivery of the liquid precursor is not needed.

6. The method of claim 1, wherein the liquid precursor comprises tetraethyl orthosilicate (TEOS).

7. The method of claim 1, wherein the purge gas comprises helium.

8. The method of claim 1, further comprising performing plasma-enhanced chemical vapor deposition (PECVD) using the substrate processing system.

9. The method of claim 1, wherein the liquid precursor comprises tetraethyl orthosilicate (TEOS) and the purge gas comprises helium.

10. The method of claim 9, further comprising depositing an interlayer dielectric (ILD) on the substrate.

* * * * *